United States Patent
Fujita et al.

(10) Patent No.: US 11,824,048 B2
(45) Date of Patent: Nov. 21, 2023

(54) POWER SEMICONDUCTOR MODULE AND COMPOSITE MODULE HAVING PERIPHERAL STRUCTURES SURROUNDING PARTS OF THE MODULE MAIN BODY

(71) Applicant: Mitsubishi Electric Corporation, Tokyo (JP)

(72) Inventors: Shigeto Fujita, Tokyo (JP); Tetsuya Matsuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 536 days.

(21) Appl. No.: 17/251,153

(22) PCT Filed: Sep. 20, 2018

(86) PCT No.: PCT/JP2018/034715
§ 371 (c)(1),
(2) Date: Dec. 10, 2020

(87) PCT Pub. No.: WO2020/059062
PCT Pub. Date: Mar. 26, 2020

(65) Prior Publication Data
US 2021/0257342 A1 Aug. 19, 2021

(51) Int. Cl.
*H05K 1/18* (2006.01)
*H01L 25/07* (2006.01)
*H01L 23/50* (2006.01)

(52) U.S. Cl.
CPC ............ *H01L 25/072* (2013.01); *H01L 23/50* (2013.01); *H05K 1/181* (2013.01); *H05K 2201/10272* (2013.01); *H05K 2201/10507* (2013.01)

(58) Field of Classification Search
CPC ....... H01L 25/072; H01L 23/50; H05K 1/181; H05K 2201/10272; H05K 2201/10507
(Continued)

(56) References Cited

U.S. PATENT DOCUMENTS

| 2005/0156251 A1 | 7/2005 | Takubo |
| 2006/0284211 A1 | 12/2006 | Takubo |
| 2015/0162219 A1* | 6/2015 | Terai ...................... H01L 21/56 257/77 |

FOREIGN PATENT DOCUMENTS

| JP | 2005183776 A | 7/2005 |
| JP | 2006351986 A | 12/2006 |
| JP | 2013012642 A | 1/2013 |

OTHER PUBLICATIONS

International Search Report issued in PCT/JP2018/034715; dated Dec. 4, 2018.

* cited by examiner

*Primary Examiner* — Hoai V Pham
(74) *Attorney, Agent, or Firm* — Studebaker & Brackett PC

(57) ABSTRACT

An uneven current distribution among a plurality of provided power semiconductor chips is to be suppressed. A power semiconductor module includes a module main body, a plurality of power semiconductor chips arranged on an upper surface of the module main body, and peripheral structures being insulating ferromagnets surrounding parts of a periphery of the module main body in a plan view, in which the plurality of power semiconductor chips are arranged in a vertical direction and a horizontal direction in a plan view, and at least one of the plurality of power semiconductor chips is arranged so as to be surrounded by other power semiconductor chips.

11 Claims, 10 Drawing Sheets

(58) Field of Classification Search
USPC .......................................................... 257/691
See application file for complete search history.

F I G. 1
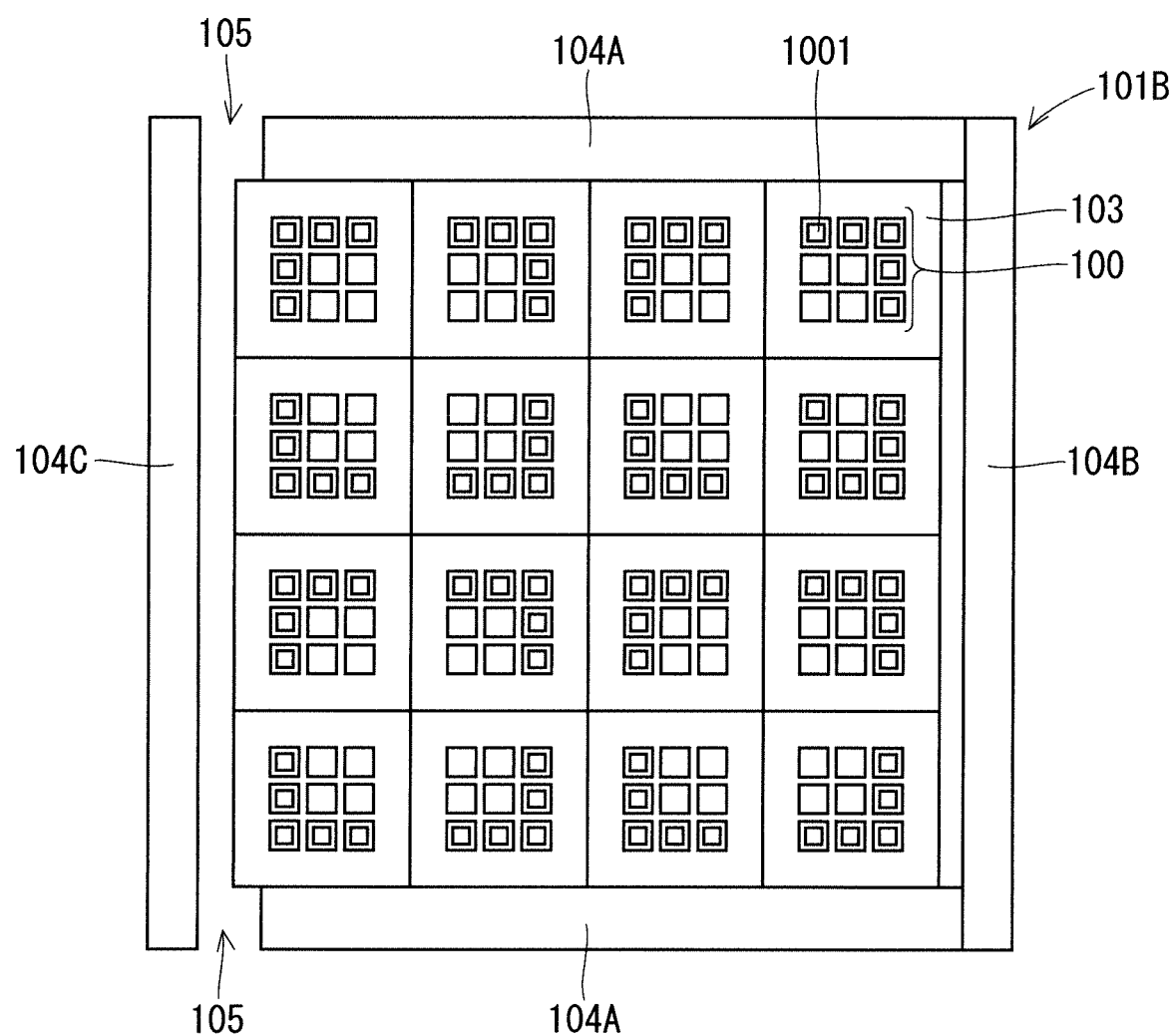

F I G. 4
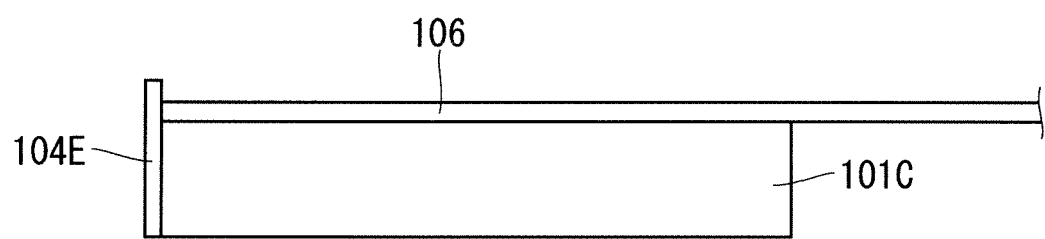

POWER SEMICONDUCTOR MODULE AND COMPOSITE MODULE HAVING PERIPHERAL STRUCTURES SURROUNDING PARTS OF THE MODULE MAIN BODY

TECHNICAL FIELD

Disclosed in the present specification is a technique relate to a power semiconductor module and a composite module.

BACKGROUND ART

Conventionally, a power semiconductor module including a plurality of power semiconductor chips has been used (see, Patent Document 1).

PRIOR ART DOCUMENTS

Patent Documents

[Patent Document 1] Japanese Patent Application Laid-Open No. 2006-351986

SUMMARY

Problem to be Solved by the Invention

While the power semiconductor module disclosed in Patent Document 1 includes a small number of power semiconductor elements, in a pressure welding type power semiconductor module including a large number of power semiconductor chips, at the time of the switching operation, the current concentrates on the power semiconductor chips located at the four corners of the pressure welding type power semiconductor module. This causes an uneven current distribution among the power semiconductor chips, and leads to a problem of uneven temperature distribution among the power semiconductor chips.

The technique disclosed in the present specification has been made to solve the above-mentioned problems, and the object thereof is to provide a technique for suppressing the uneven current distribution among a plurality of power semiconductor chips.

Means to Solve the Problem

The first mode of a technique disclosed herein includes a module main body, a plurality of power semiconductor chips arranged on an upper surface of the module main body, and peripheral structures being insulating ferromagnets surrounding parts of a periphery of the module main body in a plan view, in which the plurality of power semiconductor chips are arranged in a vertical direction and a horizontal direction in a plan view, and at least one of the plurality of power semiconductor chips is arranged so as to be surrounded by other power semiconductor chips.

Also, the second mode of a technique disclosed herein includes a module main body, a plurality of power semiconductor chips arranged on an upper surface of the module main body, and peripheral structures being insulating ferromagnets surrounding parts of a periphery of the module main body in a plan view, in which at least two cut portions in which the peripheral structures are not formed are provided in the periphery of the module main body portion.

Further, the third mode of a technique disclosed herein includes a first module structure including a first module main body and a plurality of first power semiconductor chips arranged on an upper surface of the first module main body, a second module structure including a second module main body and a plurality of second power semiconductor chips arranged on an upper surface of the second module main body, a first bus bar being an electrode, arranged on a lower surface of the first module structure, a second bus bar being an electrode, arranged on an upper surface of the first module structure and arranged on a lower surface of the second module structure, a third bus bar being an electrode, arranged on an upper surface of the second module structure, and peripheral structures being insulating ferromagnets, surrounding parts of a periphery of at least one of the first module structure and the second module structure in a plan view.

Effects of the Invention

The first mode of a technique disclosed herein includes a module main body, a plurality of power semiconductor chips arranged on an upper surface of the module main body, and peripheral structures being insulating ferromagnets surrounding parts of a periphery of the module main body in a plan view, in which the plurality of power semiconductor chips are arranged in a vertical direction and a horizontal direction in a plan view, and at least one of the plurality of power semiconductor chips is arranged so as to be surrounded by other power semiconductor chips. According to such a configuration, the magnetic field line of the magnetic field generated by the transport current shifts from the outer periphery of the pressure welding type power semiconductor module into the peripheral structure by the peripheral structure surrounding the part of the periphery of the module main body. Therefore, the concentration of the magnetic fields in the vicinities of the power semiconductor chips located at the four corners of the pressure welding type power semiconductor module is relaxed. Hence, the uneven current distribution among the plurality of provided power semiconductor chips is suppressed without causing magnetic saturation.

Also, the second mode of a technique disclosed herein includes a module main body, a plurality of power semiconductor chips arranged on an upper surface of the module main body, and peripheral structures being insulating ferromagnets surrounding parts of a periphery of the module main body in a plan view, in which at least two cut portions in which the peripheral structures are not formed are provided in the periphery of the module main body portion. According to such a configuration, the magnetic field line of the magnetic field generated by the transport current shifts from the outer periphery of the pressure welding type power semiconductor module into the peripheral structure by the peripheral structure surrounding the part of the periphery of the module main body. Therefore, the concentration of the magnetic fields in the vicinities of the power semiconductor chips located at the four corners of the pressure welding type power semiconductor module is relaxed. Hence, the uneven current distribution among the plurality of provided power semiconductor chips is suppressed without causing magnetic saturation.

Further, the third mode of a technique disclosed herein includes a first module structure including a first module main body and a plurality of first power semiconductor chips arranged on an upper surface of the first module main body, a second module structure including a second module main body and a plurality of second power semiconductor chips arranged on an upper surface of the second module main body, a first bus bar being an electrode, arranged on a lower surface of the first module structure, a second bus bar being an electrode, arranged on an upper surface of the first module structure and arranged on a lower surface of the second module structure, a third bus bar being an electrode, arranged on an upper surface of the second module structure, and peripheral structures being insulating ferromagnets, surrounding parts of a periphery of at least one of the first module structure and the second module structure in a plan view. According to such a configuration, the magnetic field line of the magnetic field generated by the transport current shifts from the outer periphery of the pressure welding type power semiconductor module into the peripheral structure by the peripheral structure surrounding the part of the periphery of the module main body. Therefore, the concentration of the magnetic fields in the vicinities of the power semiconductor chips located at the four corners of the pressure welding type power semiconductor module is relaxed. Hence, the uneven current distribution among the plurality of provided power semiconductor chips is suppressed without causing magnetic saturation.

The more explicit purpose, feature, phase, and advantage regarding to the technique disclosed in the present specification will be described in detail hereunder with accompanying drawings.

BRIEF DESCRIPTION OF DRAWINGS

FIG. 1 A plan view schematically illustrating an example of a configuration of a pressure welding type power semiconductor module according to Embodiment.

FIG. 4 A side view illustrating an example of the positional relationship between a peripheral structure and a module structure of the pressure welding type power semiconductor module according to Embodiment.

DESCRIPTION OF EMBODIMENTS

Figure 2:
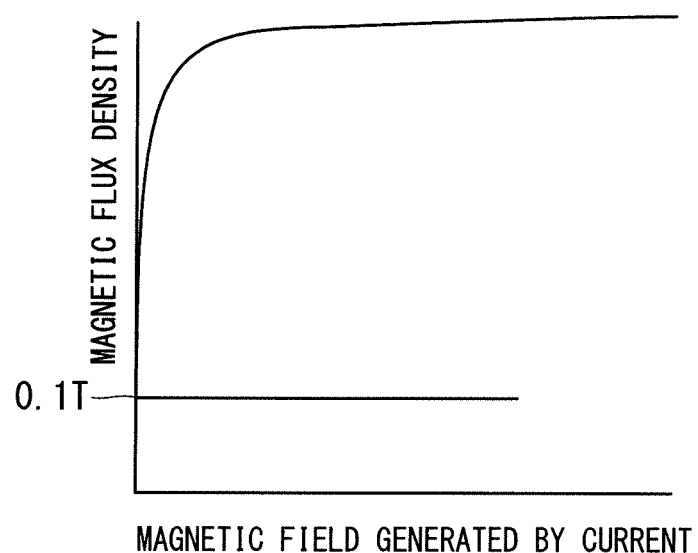
FIG. 2 A graph conceptually illustrating the correlation of the magnetic flux density in peripheral structures being insulating ferromagnets, with respect to the magnetic field generated by the transport current flowing in the configuration illustrated in FIG. 1.

Hereinafter, Embodiments will be described with reference to the accompanying drawings.

It should be noted that the drawings are schematically illustrated, and for convenience of description, configurations are omitted and/or simplified as appropriate. Also, the mutual relationship among sizes and positions in configurations and the like illustrated in respective drawings are not necessarily accurately described, and may be changed as appropriate. In addition, in the drawings such as plan views that are not cross-sectional views, hatching may be given to facilitate understanding of the contents of Embodiments.

In addition, in the following description, the same components are denoted by the same reference numerals, and the names and functions thereof are also similar. Accordingly, detailed descriptions thereof may be omitted to avoid redundancy.

Also, in the following description, even though terms indicating specific positions and directions such as "upper", "lower", "left", "right", "side", "bottom", "front", and "back" may be used, these terms are for promoting the understanding of the contents of Embodiments and are not related to the directions at the time of implementation.

Also, in the following description, even though ordinal numbers such as "first", and "second" may be used, these terms are for promoting the understanding of the contents of Embodiments and are not for defining the order caused by such ordinal numbers.

Embodiment 1

Hereinafter, a power semiconductor module according to Embodiment 1 will be described. For convenience of description, first, the magnetic field generated by the transport current in the pressure welding type power semiconductor module will be described below.

In a pressure welding type power semiconductor module including a large number of power semiconductor chips, at the time of the switching operation, the current concentrates on the power semiconductor chips located at the four corners of the pressure welding type power semiconductor module. This causes an uneven current distribution among the power semiconductor chips, and leads to a problem of uneven temperature distribution among the power semiconductor chips.

Figure 11:
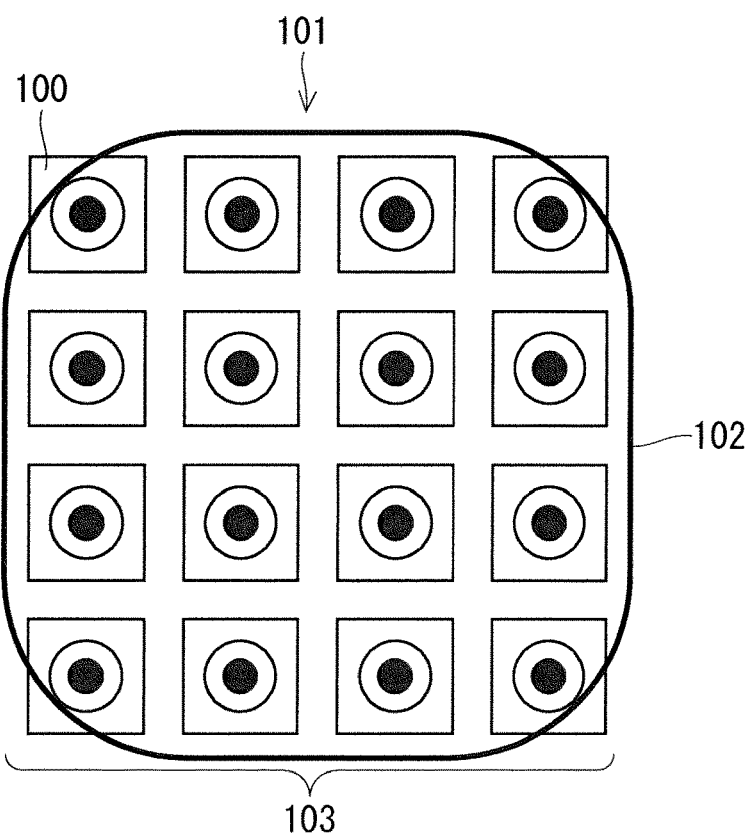
FIG. 11 A plan view schematically illustrating an example of a configuration of the pressure welding type power semiconductor module.

FIG. 11 is a plan view schematically illustrating an example of a configuration of the pressure welding type power semiconductor module. With reference to FIG. 11, the cause of uneven current distribution among submodules 100 in which a plurality of power semiconductor chips are arranged will be described.

As an example illustrated in FIG. 11, a pressure welding type power semiconductor module 101 includes a large number of submodules 100 in a module main body 103.

When the power semiconductor chips in the submodules 100 illustrated in FIG. 11 are insulated gate bipolar transistors (that is, IGBTs), the front side (that is, the front side of the sheet surface) of FIG. 11 is a collector and the back side. (that is, the back side of the sheet surface) is the emitter.

As an example illustrated in FIG. 11, a magnetic field is generated in each submodule 100 by a transport current (current flowing frontward from the sheet surface as illustrated), which is a current flowing through each submodule 100.

The magnetic field generated in each submodule 100 is canceled by the adjacent components; therefore, the magnetic field as illustrated in the magnetic field line 102 is generated in the pressure welding type power semiconductor module 101 as a whole.

The above magnetic fields (the magnetic field line 102) permeate and concentrate in the four corners of the pressure welding type power semiconductor module 101. Therefore, a current flows through the power semiconductor chips of the submodules 100 located at the four corners of the pressure welding type power semiconductor module 101 so as to cancel the magnetic fields (magnetic field line 102).

The current is a current in the same direction as the energizing current of the power semiconductor chips; therefore, the current flowing through the power semiconductor chips located at the four corners of the pressure welding type power semiconductor module 101 becomes large. Consequently, the temperature of the power semiconductor chips located at the four corners of the pressure welding type power semiconductor module 101 becomes higher than the temperature of the power semiconductor chips located at other positions in the pressure welding type power semiconductor module 101.

When the current distribution among the power semiconductor chips is uneven, it may be conceived that this may possibly cause a failure in the pressure welding type power semiconductor module 101 or this may possibly shorten the longevity of the pressure welding type power semiconductor module 101.

In order not to concentrate the current on the power semiconductor chips located at the four corners of the pressure welding type power semiconductor module 101, it needs only be configured that the magnetic fields generated by the transport current of the power semiconductor chips are not concentrated on the power semiconductor chips located at the four corners of the pressure welding type power semiconductor module 101.

The periphery of the module main body 103 in which the power semiconductor chips are arranged is surrounded using insulating ferromagnets such as ferrite, thereby the magnetic field line 102 of the magnetic fields generated by the transport current shifts from the outer periphery of the pressure welding type power semiconductor module 101 into the insulating ferromagnets.

Therefore, the concentration of the magnetic fields in the vicinities of the power semiconductor chips located at the four corners of the pressure welding type power semiconductor module 101 is relaxed.

This enables the uniformed current distribution among the power semiconductor chips. Therefore, it is expected that the local heat generation of the power semiconductor chips is suppressed.

Accordingly, improvement in the reliability and extended longevity in the pressure welding type power semiconductor module 101 are ensured.

Figure 12:
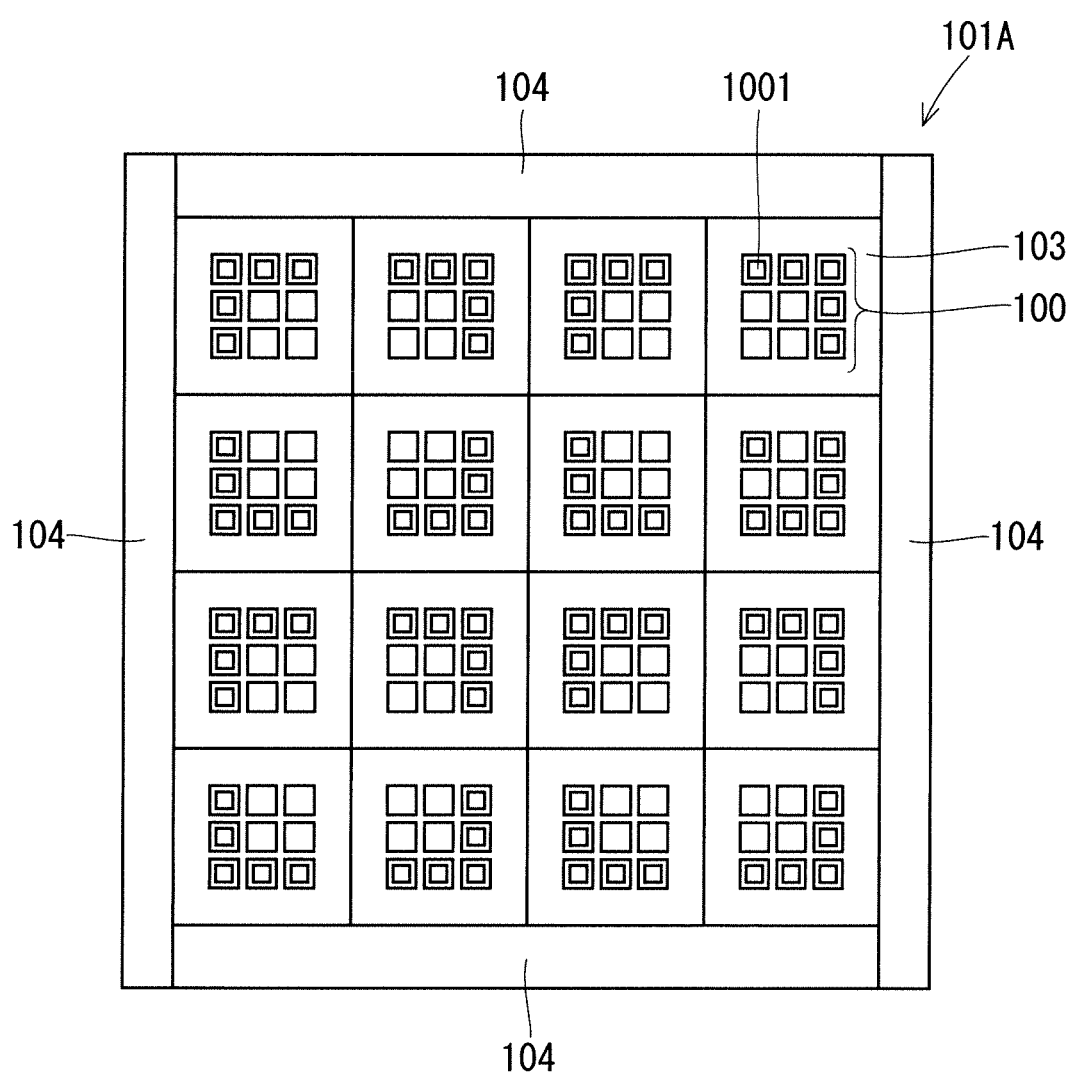
FIG. 12 A plan view schematically illustrating an example of the configuration of the pressure welding type power semiconductor module.

FIG. 12 is a plan view schematically illustrating an example of a configuration of the pressure welding type power semiconductor module. In FIG. 12, the pressure welding type power semiconductor module 101A includes a plurality of power semiconductor chips 1001 arranged on the upper surface of the module main body 103, and peripheral structures 104 being insulating ferromagnets surrounding the module main body 103 in a plan view.

Figure 13:
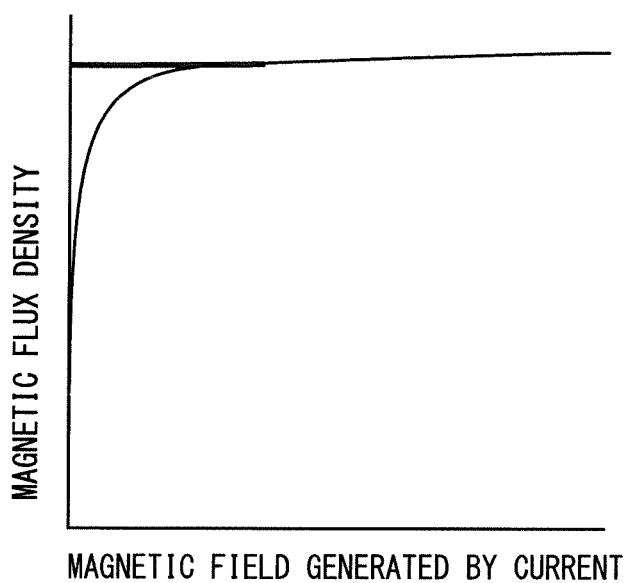
FIG. 13 A graph conceptually illustrating the correlation of the magnetic flux density in peripheral structures being insulating ferromagnets, with respect to the magnetic field generated by the transport current flowing in the configuration illustrated in FIG. 12 as an example.

Also, FIG. 13 is a graph conceptually illustrating the correlation of the magnetic flux density in peripheral structures 104 being insulating ferromagnets, with respect to the magnetic field generated by the transport current flowing in the configuration illustrated in FIG. 12 as an example. In FIG. 13, the vertical axis represents the magnetic flux density and the horizontal axis represents the magnetic field.

Referring to FIG. 13, the peripheral structures 104 being insulating ferromagnets, are magnetically saturated. Therefore, the effect of the peripheral structures 104 to take in the magnetic field is limited.

<Configuration of Power Semiconductor Module>

FIG. 1 is a plan view schematically illustrating an example of a configuration of the pressure welding type power semiconductor module according to Embodiment 1. In FIG. 1, a pressure welding type power semiconductor module 101B includes a plurality of power semiconductor chips 1001 arranged on the upper surface of the module main body 103, and peripheral structures 104A, a peripheral structure 104B, and peripheral structure 104C being insulating ferromagnets surrounding a part of the module main body 103 in a plan view.

Here, the plurality of power semiconductor chips 1001 form submodules 100 for each 3×3 layout on the semiconductor substrate, for example. In FIG. 1, in the module main body 103, the submodules 100 are arranged in a 4×4 layout.

Further, in FIG. 1, although the module main body 103 has a structure in which a plurality of submodules 100 are provided, the module main body 103 may have one submodule 100.

The plurality of power semiconductor chips 1001 are arranged in the vertical direction and the horizontal direction in FIG. 1. Also, at least one power semiconductor chip 1001 (for example, the power semiconductor chip 1001 located in the second row and second column) is placed, surrounded by another power semiconductor chips 1001 (including a case where it straddles another submodule 100).

The peripheral structures 104A, the peripheral structure 104B and the peripheral structure 104C are, for example, ferrite. The peripheral structures 104A, the peripheral structure 104B, and the peripheral structure 104C are not arranged to surround the entire periphery of the module main body 103 in a plan view. For example, as an example illustrated in FIG. 1, at least one cut portion 105 (two cut portions in FIG. 1) in which the peripheral structures 104A are not formed is formed at the periphery of the module main body portion 103.

Further, in FIG. 1, the peripheral structures 104A are provided on each opposite side of the module main body 103.

FIG. 2 is a graph conceptually illustrating the correlation of the magnetic flux density in the peripheral structures 104A, the peripheral structure 104B, and the peripheral structure 104C being insulating ferromagnets, with respect to the magnetic field generated by the transport current flowing in the configuration illustrated in FIG. 1 In FIG. 2, the vertical axis represents the magnetic flux density and the horizontal axis represents the magnetic field.

Here, the magnetic flux density B of the peripheral structures 104A, the peripheral structure 104B, and the peripheral structure 104C (ferrite) is expressed by following Expression (1).

[Expression 1]

$$B = \mu_0 \times I/d \tag{1}$$

In above Expression (1), µ0 represents the magnetic permeability in vacuum (in air), I represents the current value flowing through the pressure welding type power semiconductor module 101B, and d represents the total width of the cut portions 105.

Here, the following three assumptions are made about above Expression (1).

That is, firstly, the relative magnetic permeability µr of the insulating ferromagnet is sufficiently large. Secondly, the total width of the cut portions 105 is smaller than the total side length of the pressure welding type power semiconductor module 101B. Therefore, no generated magnetic flux leaks from the side surface of the cutting portions 105. Also, the relative magnetic permeability µr of the insulating ferromagnets is sufficiently large; therefore, no magnetic flux leaks from the side surface of the insulating ferromagnet, either.

Thirdly, the cross-sectional area of the insulating ferromagnets arranged along the sides of the module body 103 is constant. It should be noted that this assumption of "constant cross-sectional area" is for convenience of description, and may be slightly different in practice.

From the first assumption, the second assumption, and the continuity of the generated magnetic flux, the magnetic flux passing through the insulating ferromagnets including the cut portions 105 is constant.

Further, from the constant magnetic flux and the third assumption (that is, the cross-sectional area of the insulating ferromagnets being constant), the magnetic flux density (that is, magnetic flux/cross-sectional area) passing through the cut portions 105 and the insulating ferromagnets is also constant.

That is, when Bgap represents the magnetic flux density of the cut portions 105 and Bferr represents the magnetic flux density in the insulating ferromagnets, following Expression (2) is established.

[Expression 2]

$$B_{gap} = B_{ferr} \tag{2}$$

Next, the magnetic flux density Bferr in the insulating ferromagnets will be examined. First, Ampere's integral expression is represented by following Expression (3).

[Expression 3]

$$\oint H dl = I \tag{3}$$

Here, H represents a magnetic field, dl represents a distance along the sides of the module main body 103 including the cutting portions 105, and I represents a current.

When Lferr represents the length of the sides of the module body 103, d represents the total length of the widths of the cut portions 105, the Hferr represents the magnetic field of the insulating ferromagnets, and Hgap represents the magnetic field of the cut portions 105, the Ampere's integral expression is represented by following Expression (4).

[Expression 4]

$$H_{ferr} \cdot L_{ferr} + H_{gap} \cdot d = I \tag{4}$$

The above Expression (4), which is an expression for a magnetic field, is converted into an expression for a magnetic flux density. The cut portions 105 are air regions, the relationship between H and B is expressed by following Expression (5) using the magnetic permeability of vacuum.

[Expression 5]

$$H_{gap} = B_{gap}/\mu_0 \tag{5}$$

Further, the relationship between H and B in the insulating ferromagnets can be expressed by following Expression (6).

[Expression 6]

$$H_{ferr} = B_{ferr}/(\mu_r \cdot \mu_0) \tag{6}$$

By substituting Expressions (5) and (6) into above Expression (4), following Expression (7) is obtained.

[Expression 7]

$$\{B_{ferr}/(\mu_r \cdot \mu_0)\} \cdot L_{ferr} + \{B_{gap}/\mu_0\} \cdot d = I \tag{7}$$

Here, in Expression (7), the first term can be ignored from the assumption that µr is sufficiently large, Expression (7) can be converted as in Expression (8) below.

[Expression 8]

$$(B_{gap}/\mu_0) \cdot d = I \tag{8}$$

Therefore, the magnetic field passing through the cut portions 105 is expressed by following Expression (9).

[Expression 9]

$$B_{gap} = \mu_0 \cdot I/d \tag{9}$$

Further, Bgap=Bferr is established as illustrated in above Expression (2); therefore, the magnetic flux density Bferr in the insulating ferromagnets is expressed as in following Expression (10) as in above Expression (1).

[Expression 10]

$$B_{ferr} = \mu_0 \cdot I/d \tag{10}$$

Here, for example, when the total width of the cut portions 105 is 50 mm, the total length of the sides of the module body 103 of the pressure welding type power semiconductor module 101B is 1000 mm, and the current value flowing through the pressure welding type power semiconductor module 101B is 5000 A, the magnetic flux density B of the peripheral structures 104A, the peripheral structure 104B, and the peripheral structure 104C (ferrite) is expressed by following Expression (11).

[Expression 11]

$$B = \mu_0 \times 5000/0.05 = 0.1 \, [T] \tag{11}$$

With reference to FIG. 2, 0.1 [T] is sufficiently smaller than the magnetic flux density at which magnetic saturation occurs. Therefore, magnetic saturation does not occur with the configuration illustrated in FIG. 1.

This is because of an increase in the magnetic resistance of the entire magnetic circuit formed by the peripheral structures 104A, the peripheral structure 104B, the peripheral structure 104C, and the cut portions caused by providing at least one cutting portion 105 having a higher magnetic resistance than that of the insulating ferromagnet in the peripheral structures 104A, the peripheral structure 104B, and the peripheral structure 104C being insulating ferromagnets. As a result, the generated magnetic flux becomes small so that magnetic saturation does not occur.

Figure 3:
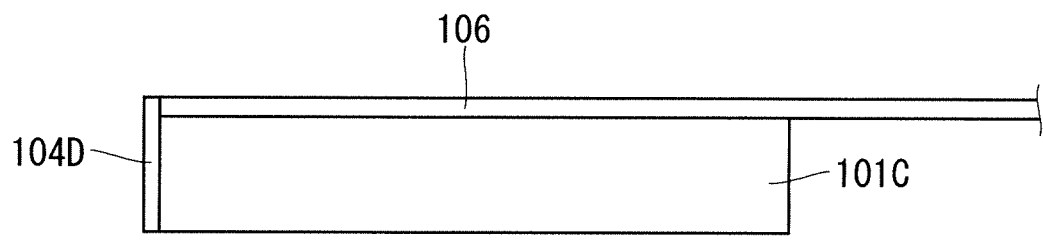
FIG. 3 A side view illustrating an example of the positional relationship between a peripheral structure and a module structure of the pressure welding type power semiconductor module according to Embodiment.

FIG. 3 is a side view illustrating an example of the positional relationship between the peripheral structure having the above cut portion and a module structure of the pressure welding type power semiconductor module. As an example illustrated in FIG. 3, the height of the peripheral structure 104D corresponding to any of the peripheral structures illustrated in FIG. 1 may be reached a bus bar 106 formed on the uppermost surface of a module structure 101C of the pressure welding type power semiconductor module.

Here, the module structure 101C includes, for example, the module main body 103 and the plurality of submodules 100 illustrated in FIG. 1.

FIG. 4 is a side view illustrating an example of the positional relationship between the peripheral structure having the above cut portion and a module structure of the pressure welding type power semiconductor module. As an example illustrated in FIG. 4, the height of the peripheral structure 104E corresponding to any of the peripheral structures illustrated in FIG. 1 may be reached a height surpassing the upper surface of the bus bar 106 formed on the uppermost surface of a module structure 101C of the pressure welding type power semiconductor module.

Embodiment 2

A power semiconductor module and a composite module including the power semiconductor module according to Embodiment 2 will be described. In the following description, components similar to those described in above Embodiment will be illustrated with the same reference numerals, and detailed description thereof will be omitted as appropriate.

<Configuration of Power Semiconductor Module>

Figure 5:
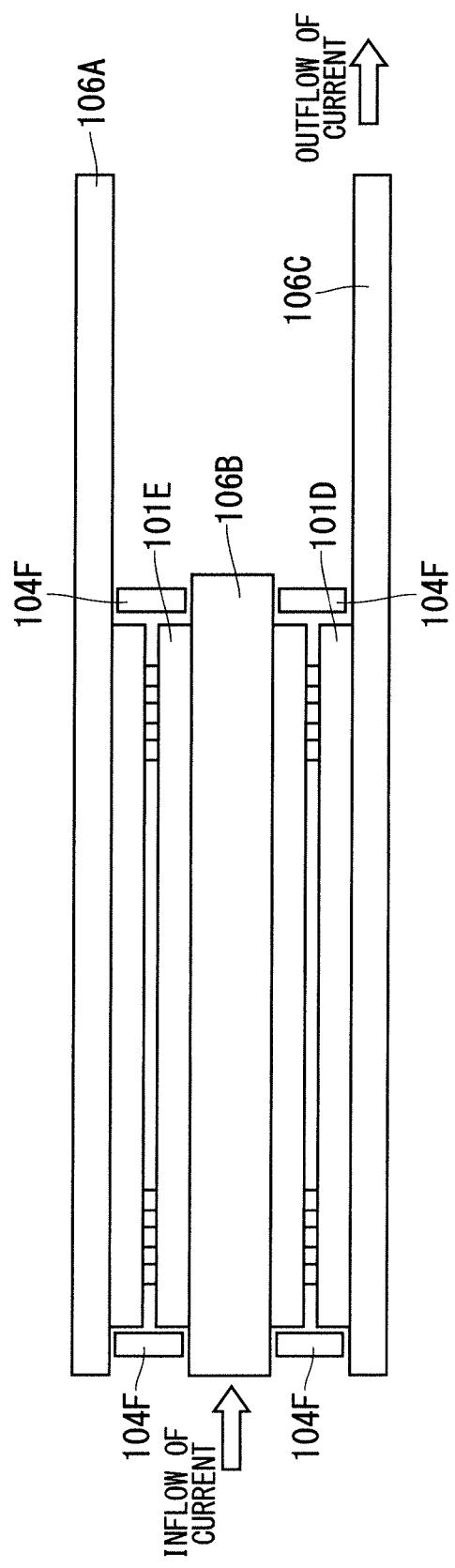
FIG. 5 A side view schematically illustrating an example of a configuration of a composite module according to Embodiment.

FIG. 5 is a side view schematically illustrating an example of a configuration of the composite module according to Embodiment 2. The composite module according to Embodiment 2 includes bus bars (electrodes) having a three-layer structure, and an upper and lower pressure welding type power semiconductor modules interposed between the bus bars.

As an example illustrated in FIG. 5, the composite module according to Embodiment 2, includes a bus bar 106C being an electrode, a module structure 101D of the pressure welding type power semiconductor module, disposed on the upper surface of the bus bar 106C, a bus bar 106B being an electrode, disposed on the upper surface of the module structure 101D, a module structure 101E of the pressure welding type power semiconductor module, disposed on the upper surface of the bus bar 106B, and a bus bar 106A being an electrode, disposed on the upper surface of the module structure 101E.

Among the above, the module structure 101D and the module structure 101E include the module main body 103 and a plurality of submodules 100 illustrated in FIG. 1, and are, for example, IGBTs. The bus bar 106B also functions as a cooler.

Further, peripheral structures 104F being insulating ferromagnets such as ferrite, are arranged at the periphery of at least one of the module structure 101D and the module structure 101E in a plan view.

The peripheral structures 104F are arranged so as to surround at least one of two sides perpendicular to the sheet surface in the periphery of the module main body in the pressure welding type power semiconductor module.

Further, the peripheral structures 104F arranged at the periphery of the module structure 101D are arranged so as to be interposed between the bus bar 106B and the bus bar 106C.

Further, the peripheral structures 104F arranged at the periphery of the module structure 101E are arranged so as to be interposed between the bus bar 106B and the bus bar 106A.

According to the configuration of Embodiment 2, when the peripheral structures 104F are provided to a modular multilevel converter (MMC), the peripheral structures 104F are properly disposed even if any of the bus bars is disposed beyond the periphery of the module structure.

Meanwhile, in the periphery of the module main body in the pressure welding type power semiconductor module illustrated in FIG. 5, only a part of the peripheral structure is arranged at positions corresponding to two sides parallel to the sheet surface.

Figure 6:
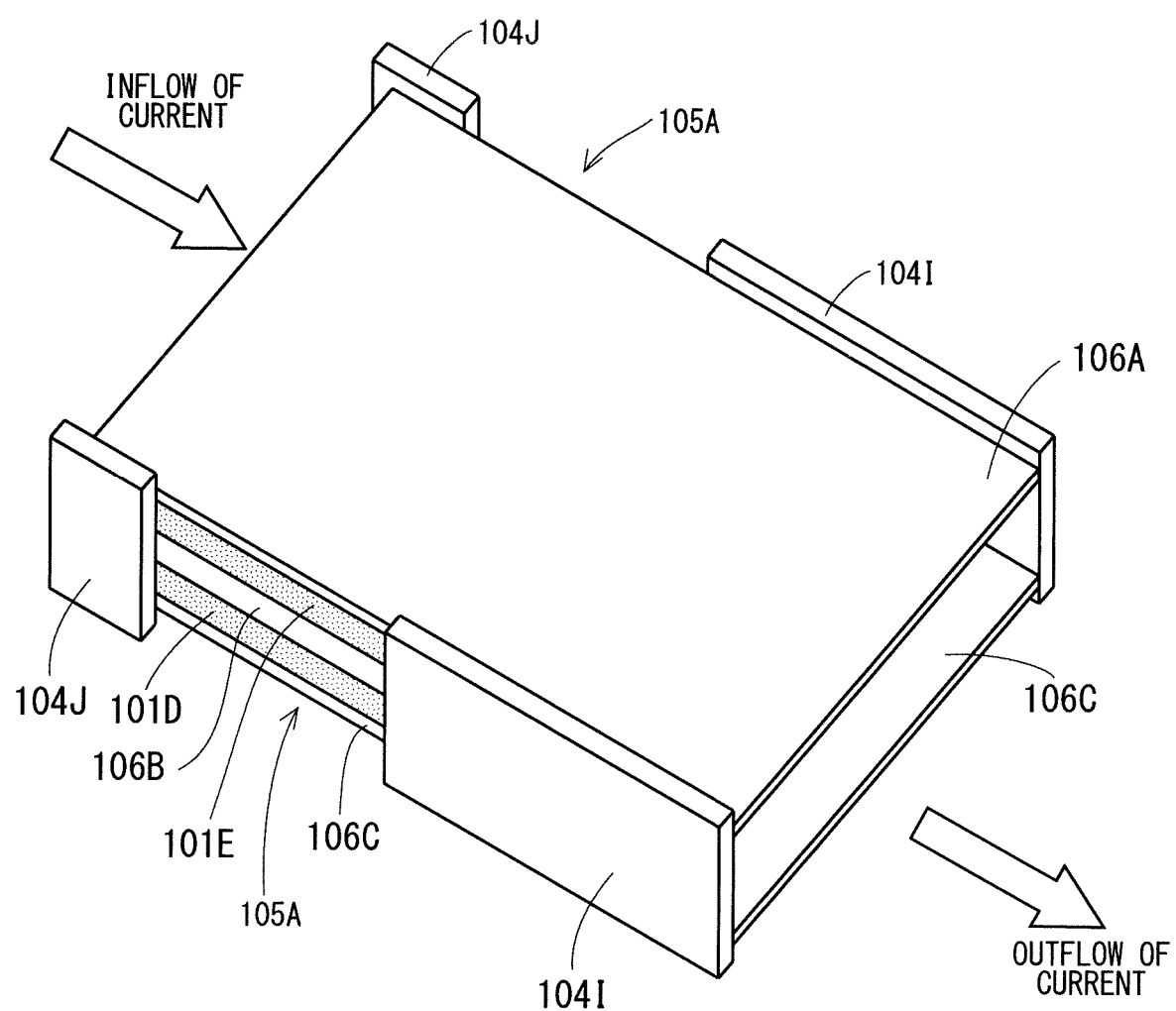
FIG. 6 A perspective view schematically illustrating an example of the configuration of the composite module according to Embodiment illustrated in FIG. 5 as an example.

FIG. 6 is a perspective view schematically illustrating an example of the configuration of the composite module according to Embodiment 2 illustrated in FIG. 5 as an example.

As an example illustrated in FIG. 6, the peripheral structures 104I and the peripheral structures 104J are arranged at the positions corresponding to the two sides of the module body of the pressure welding type power semiconductor module illustrated in FIG. 5. The two sides parallel to the sheet surface.

As an example illustrated in FIG. 6, the peripheral structures 104I and the peripheral structures 104J are arranged apart from each other. As a result, the cut portions 105A are formed on the sides of the module main body where each peripheral structure 104I and each peripheral structure 104J are arranged.

Embodiment 3

A power semiconductor module and a composite module including the power semiconductor module according to Embodiment 3 will be described. In the following description, components similar to those described in above Embodiments will be illustrated with the same reference numerals, and detailed description thereof will be omitted as appropriate.

<Configuration of Power Semiconductor Module>

Figure 7:
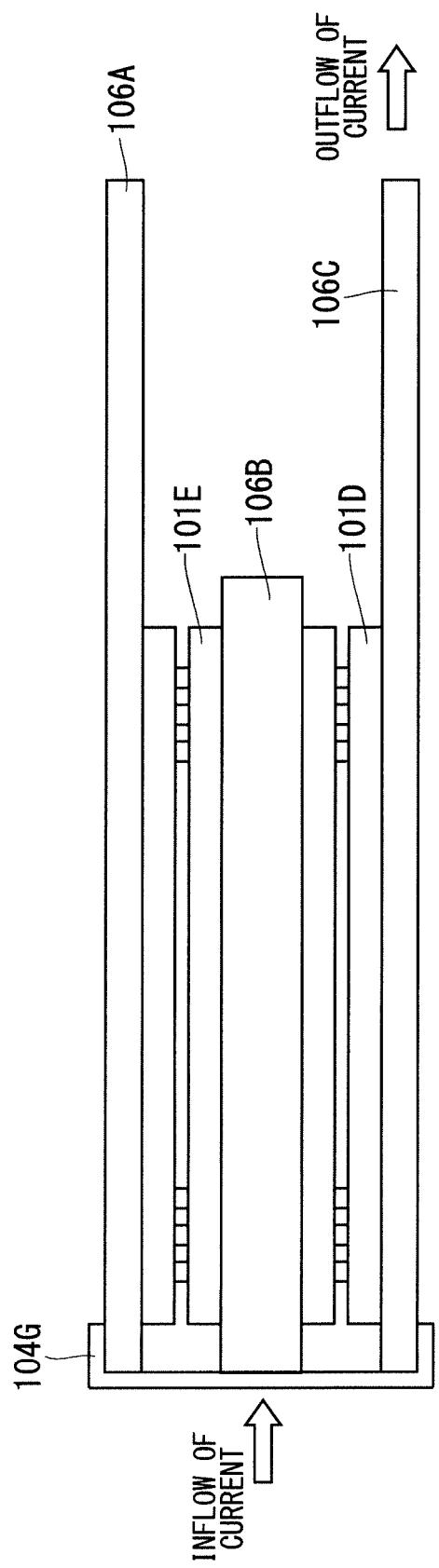
FIG. 7 A side view schematically illustrating an example of a configuration of the composite module according to Embodiment.

FIG. 7 is a side view schematically illustrating an example of a configuration of the composite module according to Embodiment 3. The composite module according to Embodiment 3 includes bus bars (electrodes) having a three-layer structure and an upper and lower pressure welding type power semiconductor modules interposed between the bus bars.

As an example illustrated in FIG. 7, the composite module according to Embodiment 3, includes a bus bar 106C, a module structure 101D disposed on the upper surface of the bus bar 106C, a bus bar 106B disposed on the upper surface of the module structure 101D, a module structure 101E disposed on the upper surface of the bus bar 106B, and a bus bar 106A disposed on the upper surface of the module structure 101E.

Further, the composite module according to Embodiment 3 includes a peripheral structure 104G being an insulating ferromagnet such as ferrite, is formed extending from the lower surface of the bus bar 106C to the upper surface of the bus bar 106A. The peripheral structure 104G is formed such that the peripheral structure 104G covers the lower surface and the side surface of the bus bar 106C, covers the side surface of the bus bar 106B, and covers the upper surface and the side surface of the bus bar 106A.

The peripheral structure 104G is arranged so as to surround a side perpendicular to the sheet surface in the periphery of the module main body in the pressure welding type power semiconductor module.

The peripheral structure 104G surrounds a part of the periphery of the module main body in the pressure welding type power semiconductor module in a plan view by covering the side surface of the bus bar 106C, the side surface of the bus bar 106B, and the side surface of the bus bar 106A. Further, the peripheral structure 104G surrounds the periphery of the module main body in the pressure welding type power semiconductor module in a side view by covering the lower surface of the bus bar 106C and the upper surface of the bus bar 106A.

Note that, the peripheral structures as the example illustrated in FIG. 6 are arranged at the positions corresponding to the two sides parallel to the sheet surface of the module body of the pressure welding type power semiconductor module illustrated in FIG. 7.

Figure 8:
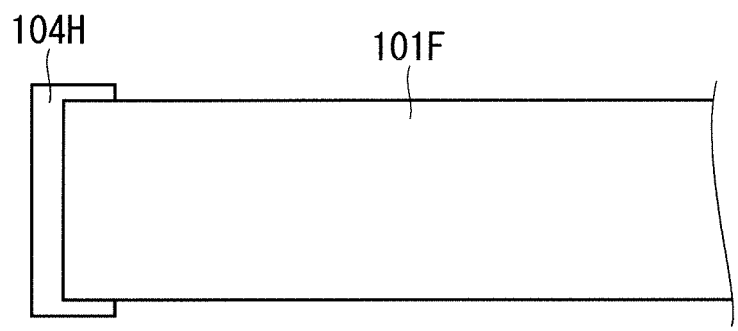
FIG. 8 A side view illustrating an example of the positional relationship between a peripheral structure and the structure of the pressure welding type power semiconductor module according to Embodiment.

FIG. 8 is a side view illustrating an example of the positional relationship between a peripheral structure and the structure of the pressure welding type power semiconductor module. As the example illustrated in FIG. 8, the peripheral structure 104H being an insulating ferromagnet such as ferrite, is formed extending from the lower surface and the side surface of the module structure 101F of the pressure welding type power semiconductor module to the upper surface of the module structure 101F.

Here, the module structure 101F includes, for example, the module main body 103 and the plurality of submodules 100 illustrated in FIG. 1.

The peripheral structure 104H is arranged so as to surround a side perpendicular to the sheet surface in the periphery of the module main body in the pressure welding type power semiconductor module.

The peripheral structure 104H surrounds a part of the periphery of the module main body in the pressure welding type power semiconductor module in a plan view by covering the side surface of the module main body 101F. Further, the peripheral structure 104H surrounds the periphery of the module main body in the pressure welding type power semiconductor module in a side view by covering the lower surface and the upper surface of the module main body 101F.

Note that, the peripheral structures as illustrated in FIG. 6 are arranged at the positions corresponding to the two sides parallel to the sheet surface of the module body of the pressure welding type power semiconductor module illustrated in FIG. 8.

As the example illustrated in FIG. 7, in a case where the peripheral structure formed extending from the lower surface of the bus bar 106C to the upper surface of the bus bar 106A is included, an other side (that is, the side on the right side in FIG. 7) perpendicular to the sheet surface in the periphery of the module main body in the pressure welding type power semiconductor module may be surrounded by the peripheral structures 104F illustrated in Embodiment 3.

Further, the pressure welding type power semiconductor module may be provided with the peripheral structure illustrated in Embodiment 3 and, for example, the peripheral structure illustrated in Embodiment 1 in a mixed manner.

According to the configuration of the Embodiment 3, the effect that the peripheral structure takes in the magnetic field is more enhanced than case of having a plate-shaped peripheral structure that covers only the side surface of the bus bar because the ferromagnet covers the lower surface of the bus bar 106C and the upper surface of the bus bar 106A.

Embodiment 4

The power semiconductor module according to Embodiment 4 will be described. In the following description, components similar to those described in above Embodiments will be illustrated with the same reference numerals, and detailed description thereof will be omitted as appropriate.

<Configuration of Power Semiconductor Module>

Figure 9:
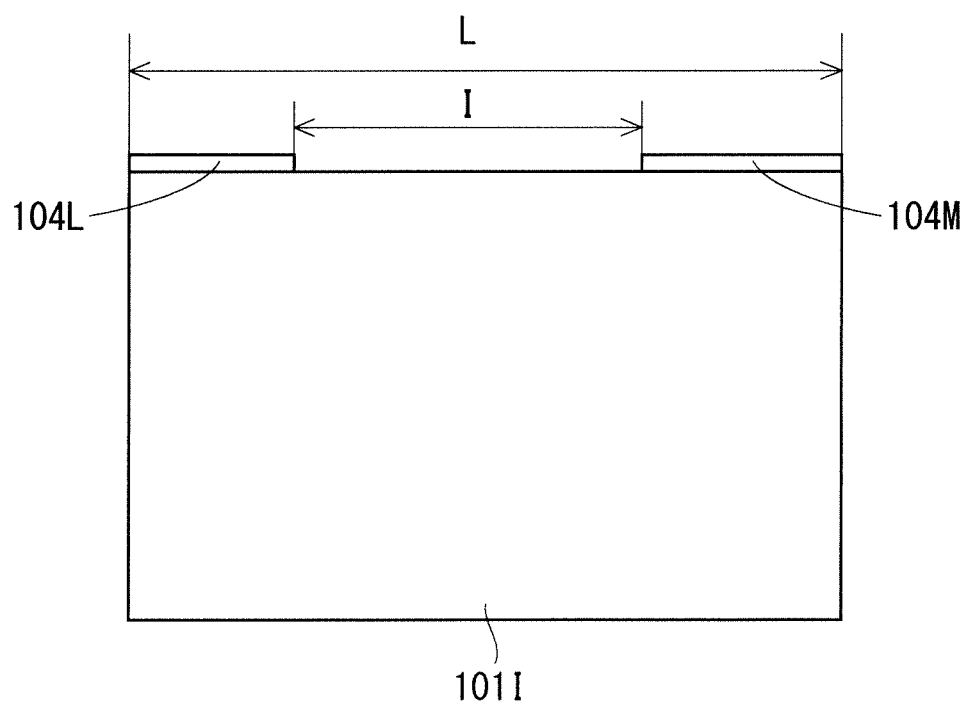
FIG. 9 A plan view illustrating an example of the positional relationship between peripheral structures and the structure of the pressure welding type power semiconductor module according to Embodiment.

FIG. 9 is a plan view illustrating an example of the positional relationship between a peripheral structure having a cut portion and the structure of the pressure welding type power semiconductor module. As the example illustrated in FIG. 9, the peripheral structure 104L and the peripheral structure 104M being insulating ferromagnets such as ferrite, are formed in a part of the periphery of a module structure 101I of a pressure welding type power semiconductor module. In FIG. 9, on one side of the periphery of the module structure 101I, the peripheral structure 104L and the peripheral structure 104M are formed so as to be separated from each other.

Here, the module structure 101I includes, for example, the module main body 103 and the plurality of submodules 100 illustrated in FIG. 1.

Here, a distance l between the peripheral structure 104L and the peripheral structure 104M is a half or more of a length L of the side of the module main body along the direction in which the peripheral structure 104L and the peripheral structure 104M are separated from each other.

By setting the distance l between the peripheral structure 104L and the peripheral structure 104M as described above, the magnetic resistance of the magnetic circuit including the peripheral structure 104L, the peripheral structure 104M, and the portion where none of them are formed becomes sufficiently large. Hence, the magnetic flux generated by the transport current is reduced, enabling to reliably suppress magnetic saturation.

Embodiment 5

The power semiconductor module according to Embodiment 5 will be described. In the following description, components similar to those described in above Embodiments will be illustrated with the same reference numerals, and detailed description thereof will be omitted as appropriate.

<Configuration of Power Semiconductor Module>

Figure 10:
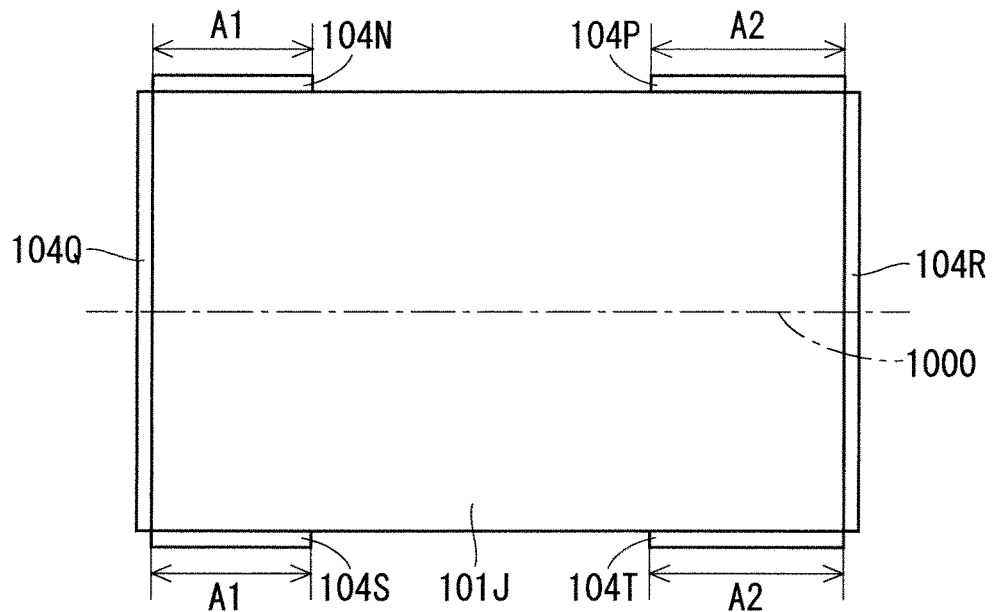
FIG. 10 A plan view illustrating an example of the positional relationship between peripheral structures and the structure of the pressure welding type power semiconductor module according to Embodiment.

FIG. 10 is a plan view illustrating an example of the positional relationship between peripheral structures having cut portions and the structure of the pressure welding type power semiconductor module. As the example illustrated in FIG. 10, a peripheral structure 104N and a peripheral structure 104P being insulating ferromagnets such as ferrite, are formed in a part of the periphery of a module structure 101J of a pressure welding type power semiconductor module. In FIG. 10, on one side of the periphery of the module structure 101J, the peripheral structure 104N and the peripheral structure 104P are formed so as to be separated from each other.

Here, the module structure 101J includes, for example, the module main body 103 and the plurality of submodules 100 illustrated in FIG. 1.

Also, as the example illustrated in FIG. 10, a peripheral structure 104S and a peripheral structure 104T being insulating ferromagnets such as ferrite, are formed in a part of the periphery of a module structure 101J of a pressure welding type power semiconductor module. In FIG. 10, on another one side of the periphery of the module structure 101J, the peripheral structure 104S and the peripheral structure 104T are formed so as to be separated from each other.

Also, as the example illustrated in FIG. 10, a peripheral structure 104Q and a peripheral structure 104R being insulating ferromagnets such as ferrite, are formed, respectively, on the other one side of the periphery of a module structure 101J of a pressure welding type power semiconductor module.

Further, the peripheral structure 104N and the peripheral structure 104S are located on opposite sides of the module structure 101J and are line-symmetric with respect to the center line 1000. That is, in the peripheral structure 104N and the peripheral structure 104S, the formed widths A1 are the same, and the formed areas thereof and the arranged positions thereof on the opposite sides are the same.

Further, the peripheral structure 104P and the peripheral structure 104T are located on opposite sides of the module structure 101J and are line-symmetric with respect to the center line 1000. That is, in the peripheral structure 104P and the peripheral structure 104T, the formed widths A2 are the same, and the formed areas thereof and the arranged positions thereof on the opposite sides are the same.

By forming the peripheral structure 104N, the peripheral structure 104S, the peripheral structure 104P, and the peripheral structure 104T as described above, standardization of the components is realized. Material processing is facilitated thereby.

The forming positions and number of the peripheral structures of the pressure welding type power semiconductor module are not limited to the examples illustrated in above-described Embodiments. For example, in FIG. 10, the widths A1 of the peripheral structure 104N and the width A2 of the peripheral structure 104P may be the same, but Embodiment 5 is not limited to the case where the widths A1 are the same.

Effects Produced by Embodiments Described Above

Next, an example of the effects produced by Embodiments described above will be described. Although, in the following description, the effects are described based on the specific configuration illustrated in Embodiments described above, the specific configuration may be replaced, within the scope where the same effects are produced, with other specific configuration of which example will be illustrated in the present specification.

Further, the replacement may be delivered across a plurality of Embodiments. That is, it may be the case that the respective configurations illustrated in the examples in different Embodiments are combined to produce the same effects.

According to Embodiments described above, the power semiconductor module includes the module main body 103, a plurality of power semiconductor chips 1001, and peripheral structures 104A being insulating ferromagnets. The power semiconductor chips 1001 are arranged on the upper surface of the module main body 103. The peripheral structures 104A surround parts of the periphery of the module main body 103 in a plan view. The plurality of power semiconductor chips 1001 are arranged in the vertical direction and the horizontal direction. Then, at least one power semiconductor chip 1001 is arranged so as to be surrounded by the other power semiconductor chips 1001.

According to such a configuration, the magnetic field line 102 of the magnetic field generated by the transport current shifts from the outer periphery of the pressure welding type power semiconductor module into the peripheral structures 104A by the peripheral structures 104A surrounding the parts of the periphery of the module main body 103. Therefore, the concentration of the magnetic fields in the vicinities of the power semiconductor chips 1001 located at the four corners of the pressure welding type power semiconductor module is relaxed. Hence, the uneven current distribution among the plurality of provided power semiconductor chips 1001 is suppressed without causing magnetic saturation.

Further, according to Embodiments described above, the power semiconductor module includes the module main body 103, a plurality of power semiconductor chips 1001, and peripheral structures 104A being insulating ferromagnets. The power semiconductor chips 1001 are arranged on the upper surface of the module main body 103. The peripheral structures 104A surround parts of the periphery of the module main body 103 in a plan view. Then, at least two cut portions 105 in which the peripheral structures 104A are not formed are provided in the periphery of the module main body portion 103.

According to such a configuration, the magnetic field line 102 of the magnetic field generated by the transport current shifts from the outer periphery of the pressure welding type power semiconductor module into the peripheral structures 104A by the peripheral structures 104A surrounding the parts of the periphery of the module main body 103. Therefore, the concentration of the magnetic fields in the vicinities of the power semiconductor chips 1001 located at the four corners of the pressure welding type power semiconductor module is relaxed. Hence, the uneven current distribution among the plurality of provided power semiconductor chips 1001 is suppressed without causing magnetic saturation.

Noted that, other configurations other than these configurations, of which examples are illustrated in the present specification, may be omitted as appropriate. That is, the effects described above are produced as long as at least these configurations are provided.

However, even if at least one of the other configurations illustrated herein is added to the configurations described above as appropriate, that is, even if other configurations not mentioned herein as the above configurations are appropriately added to the specification of the present application, the same effects can be produced.

Further, according to Embodiments described above, the width of each cut portion 105 in the circumferential direction is a half or more of the length of the side of the module main body portion 103. According to such a configuration, the magnetic resistance of the magnetic circuit including the peripheral structure 104L, the peripheral structure 104M, and the portion where none of them are formed becomes sufficiently large. Hence, the magnetic flux generated by the transport current is reduced, enabling to reliably suppress magnetic saturation.

Further, according to Embodiments described above, the peripheral structures 104A are provided on each opposite side of the module main body 103. According to such a configuration, parts of the periphery of the module main body 103 in a plan view can be effectively surrounded.

Further, according to Embodiments described above, the peripheral structure 104N and the peripheral structure 104S are line-symmetric with respect to the center line 1000 of the module main body 103 parallel to the opposite sides. According to such a configuration, the same structure is applicable to the peripheral structure 104N and the peripheral structure 104S, which facilitates manufacturing and assembly.

Further, according to Embodiments described above, the peripheral structure 104H and the peripheral structure 104J surround a part of the periphery of the module body 103 in a plan view and the periphery of the module body 103 in a side view. According to such a configuration, the ferromagnets surround the periphery of the module main body 103 in a side view in addition to the periphery in a plan view; therefore, the effect of the peripheral structures taking in the magnetic field is enhanced.

Further, according to Embodiments described above, the power semiconductor module includes the bus bar 106 arranged above the power semiconductor chips 1001. The peripheral structure 104D is provided so as to reach the upper surface of the bus bar 106. According to such a configuration, the magnetic field line of the magnetic field generated by the transport current shifts from the outer periphery of the pressure welding type power semiconductor module into the peripheral structure 104D by the peripheral structure 104D surrounding the part of the periphery of the module main body 103. Therefore, the concentration of the magnetic fields in the vicinities of the power semiconductor chips 1001 located at the four corners of the pressure welding type power semiconductor module is relaxed.

Further, according to Embodiments described above, the peripheral structure 104E is provided so as to be beyond the upper surface of the bus bar 106. According to such a configuration, the magnetic field line of the magnetic field generated by the transport current shifts from the outer periphery of the pressure welding type power semiconductor module into the peripheral structure 104E by the peripheral structure 104E surrounding the part of the periphery of the module main body 103. Therefore, the concentration of the magnetic fields in the vicinities of the power semiconductor chips 1001 located at the four corners of the pressure welding type power semiconductor module is relaxed.

Further, according to Embodiments described above, the composite module includes a first module structure, a second module structure, a first bus bar being an electrode, a second bus bar being an electrode, a third bus bar being an electrode, and the peripheral structures 104F being an insulating ferromagnet. Here, the first module structure corresponds to, for example, the module structure 101D. Also, the second module structure corresponds to, for example, the module structure 101E. The first bus bar corresponds to, for example, the bus bar 106C. The second bus bar corresponds to, for example, the bus bar 106B. The third bus bar corresponds to, for example, the bus bar 106A. The module structure 101D includes a first module main body and a plurality of first power semiconductor chips arranged on the upper surface of the first module main body. Here, the first module main body corresponds to, for example, the module main body 103. Further, the first power semiconductor chips correspond to, for example, the power semiconductor chips 1001. The module structure 101E includes a second module main body and a plurality of second power semiconductor chips arranged on the upper surface of the second module main body. Here, the second module main body corresponds to, for example, the module main body 103. Further, the second power semiconductor chips correspond to, for example, the power semiconductor chips 1001, The bus bar 106C is arranged on the lower surface of the module structure 101D. The bus bar 106B is arranged on the upper surface of the module structure 101D and is arranged on the lower surface of the module structure 101E. The bus bar 106A is arranged on the upper surface of the module structure 101E. And, the peripheral structures 104F being insulating ferromagnets such as ferrite, surround a part of the periphery of at least one of the module structure 101D and the module structure 101E in a plan view.

According to such a configuration, the magnetic field line of the magnetic field generated by the transport current shifts from the outer periphery of the pressure welding type power semiconductor module into the peripheral structure 104F by the peripheral structure 104F surrounding the part of the periphery of the module main body. Therefore, the concentration of the magnetic fields in the vicinities of the power semiconductor chips located at the four corners of the pressure welding type power semiconductor module is relaxed. Hence, the uneven current distribution among the plurality of provided power semiconductor chips is suppressed without causing magnetic saturation.

Noted that, other configurations other than these configurations, of which examples are illustrated in the present specification, may be omitted as appropriate. That is, the effects described above are produced as long as at least these configurations are provided.

However, even if at least one of the other configurations illustrated herein is added to the configurations described above as appropriate, that is, even if other configurations not mentioned herein as the above configurations are appropriately added to the specification of the present application, the same effects can be produced.

Further, according to Embodiments described above, the peripheral structures 104F are arranged so as to be interposed between the bus bar 106C and the bus bar 106B or between the bus bar 106B and the bus bar 106A. According to such a configuration, when the peripheral structures 104F are provided to an MMC, the peripheral structures 104F are properly disposed even if any of the bus bars is disposed beyond the periphery of the module structure.

Further, according to Embodiments described above, the peripheral structure 104G is formed from the lower surface of the bus bar 106C to the upper surface of the bus bar 106A. According to such a configuration, the effect that the peripheral structure takes in the magnetic field is more enhanced than the case of having a plate-shaped peripheral structure that covers only the side surface of the bus bar because the ferromagnet covers the lower surface of the bus bar 106C and the upper surface of the bus bar 106A.

Modification in Embodiments Described Above

Although in Embodiments described above, the texture, material, dimensions, shape, relative arrangement relationship or implementation conditions of each component may be described, these are examples in all aspects and are not limited to those described herein.

Accordingly, it is understood that numerous other modifications variations, and equivalents can be devised without departing from the scope of the invention. For example, Modification includes, modifying, adding or omitting at least one component, or extracting at least one component in at least one Embodiment and combining the component with the other components.

In addition, so far as consistent with Embodiments, in a component described that the number thereof to be provided is "one" in above-described Embodiments, the number thereof to be provided may be "one or more".

Furthermore, each component in Embodiments described above is a conceptual unit, and the scope of the technique disclosed in the present specification shall include the conditions, following: one component consists of a plurality of components, one component corresponds to a part of a structure, and further, a plurality of components are provided with one structure.

In addition, each component in above-described Embodiment shall include another structure or a structure having a shape as long as the same function is exhibited.

In addition, the description in the present specification is referred to for all purposes relating to the present technique, and does not acknowledge to be a prior art.

Further, in above-described Embodiments, when a material name or the like is described without being specified, the material contains other additives, for example, an alloy or the like, so far as consistent with Embodiments.

EXPLANATION OF REFERENCE SIGNS 100 submodule, 101, 101A, 101B pressure welding type power semiconductor module, 101C, 101D, 101E, 101F, 101I, 101J module structure, 102 magnetic field line, 103 module main body, 104, 104A, 104B, 104C, 104D, 104E, 104F, 104G, 104H, 104I, 104J, 104L, 104M, 104N, 104P, 104Q, 104R, 104S, 104T peripheral structure, 105, 105A cut portion, 106, 106A, 106B, 106C bus bar, 1000 center line, 1001 power semiconductor chip, A1, A2 width.

The invention claimed is:

1. A power semiconductor module comprising:
a module main body;
a plurality of power semiconductor chips arranged on an upper surface of the module main body; and
peripheral structures being insulating ferromagnets surrounding parts of a periphery of the module main body in a plan view, wherein
the plurality of power semiconductor chips are arranged in a vertical direction and a horizontal direction in a plan view, and
at least one of the plurality of power semiconductor chips is arranged so as to be surrounded by other power semiconductor chips.

2. The power semiconductor module according to claim 1, wherein
the peripheral structures are provided on each opposite side of the module main body.

3. The power semiconductor module according to claim 2, wherein
each peripheral structure is line-symmetric with respect to a center line of the module main body parallel to the opposite side.

4. The power semiconductor module according to claim 1, wherein
the peripheral structures surround parts of the periphery of the module main body in a plan view and the periphery of the module main body in a side view.

5. The power semiconductor module according to claim 1, further comprising
a bus bar arranged above the plurality of power semiconductor chips, wherein
the peripheral structures are provided so as to reach an upper surface of the bus bar.

6. The power semiconductor module according to claim 5, wherein
the peripheral structures are provided so as to be beyond the upper surface of the bus bar.

7. A power semiconductor module comprising:
a module main body;
a plurality of power semiconductor chips arranged on an upper surface of the module main body; and
peripheral structures being insulating ferromagnets surrounding parts of a periphery of the module main body in a plan view, wherein
at least two cut portions in which the peripheral structures are not formed are provided in the periphery of the module main body portion.

8. The power semiconductor module according to claim 7, wherein
a width of each cut portion in a circumferential direction is a half or more of a length of a side of the module main body portion.

9. A composite module comprising:
a first module structure including a first module main body and a plurality of first power semiconductor chips arranged on an upper surface of the first module main body;
a second module structure including a second module main body and a plurality of second power semiconductor chips arranged on an upper surface of the second module main body;
a first bus bar being an electrode, arranged on a lower surface of the first module structure;
a second bus bar being an electrode, arranged on an upper surface of the first module structure and arranged on a lower surface of the second module structure;
a third bus bar being an electrode, arranged on an upper surface of the second module structure; and
peripheral structures being insulating ferromagnets, surrounding parts of a periphery of at least one of the first module structure and the second module structure in a plan view.

10. The composite module according to claim 9, wherein
the peripheral structures are arranged so as to be interposed between the first bus bar and the second bus bar or between the second bus bar and the third bus bar.

11. The composite module according to claim 9, wherein
the peripheral structure is formed from a lower surface of the first bus bar to an upper surface of the third bus bar.

* * * * *